United States Patent
Flamm et al.

(10) Patent No.: US 6,320,760 B1
(45) Date of Patent: Nov. 20, 2001

(54) MULTIPLE PCI CARD SUPPORT

(75) Inventors: Ronald C. Flamm, Olympia; Anthony P. Valpiani; Glen P. Gordon, both of Graham, all of WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/384,389

(22) Filed: Aug. 27, 1999

(51) Int. Cl.⁷ ..................................................... H05K 7/12
(52) U.S. Cl. ......................... 361/801; 361/759; 361/802; 211/41.17
(58) Field of Search .................................... 361/686, 759, 361/801, 802, 756, 740, 825; 439/377; 211/41.17; 312/215, 216; 70/85, 95

(56) References Cited

U.S. PATENT DOCUMENTS

| | | | |
|---|---|---|---|
| 5,544,006 | * 8/1996 | Radloff et al. | 361/683 |
| 5,754,406 | * 5/1998 | Hardt et al. | 361/756 |
| 5,757,618 | * 5/1998 | Lee | 361/868 |
| 5,982,627 | * 11/1999 | Haughton et al. | 361/759 |

* cited by examiner

Primary Examiner—Jayprakash N. Gandhi
(74) Attorney, Agent, or Firm—Antonelli, Terry, Stout & Kraus, LLP

(57) ABSTRACT

A card support releasably retains the edges of a plurality of electronic cards in a card guide panel. The card support is formed with a card support bracket and a plurality of card retention tabs connected to the bracket by way of flexible members for releasably retaining the edges of respective cards in guide channels of the card guide panel. The retention tabs have ramps on one side for engagement with the edges of the cards being installed for momentarily moving the tabs back out of the way, allowing the cards to slide past the tabs. Once installed, the opposite sides of the tabs, which are flat, extend over the rear edge of the installed cards to retain them in the guide channels, especially during shock and vibration, including dropping the box upside down.

23 Claims, 2 Drawing Sheets

MULTIPLE PCI CARD SUPPORT

TECHNICAL FIELD

A card support is disclosed for retaining the edges of a plurality of electronic cards in a card guide panel during shock and vibration.

BACKGROUND

A trend in the computer industry is to servers having multiple components such as power supplies, fans and PCI cards, for example, a four-way server which has four redundant components inside and an eight-way server containing eight redundant components. An advantage of these servers is that if one component in a server goes down, the server can still keep running, e.g., a user can replace a defective electronic card or other component using "hot swapping" without crashing the system.

State-of-the-art electronic card supports normally retain one card at a time and may require screws or rivets for attachment. A screw implementation is disadvantageous in a hot-swap system because too much time is required to remove/replace the screw, and there is a danger that the loosened screw could fall onto powered components to result in an electrical disaster. One disadvantageous PCI card retainer which eliminates the need for removing/replacing the screw for installing or removing an electronic card is lever actuated and relies on friction to retain the card. This design has snap features for installation, but requires one retainer for each individual PCI card. The known retainer also does not block vertical travel of the card in the case the computer box is dropped upside down or otherwise subjected to shock or vibration. This problem is particularly acute with longer and heavier electronic cards, e.g., in supporting standard full-length PCI cards, particularly in systems which must be resistant to shock and vibration.

SUMMARY

An improved card support for retaining the edges of a plurality of electronic cards in a card guide panel is disclosed. The card support includes a card support bracket and a plurality of card retention tabs connected to the bracket for retaining the edges of respective cards in the card guide panel.

These and other features of the improved card support will become more apparent from the following description when taken in connection with the accompanying drawings which show, for purposes of illustration only, one example in accordance with the present invention.

DETAILED DESCRIPTION

Figure 1:
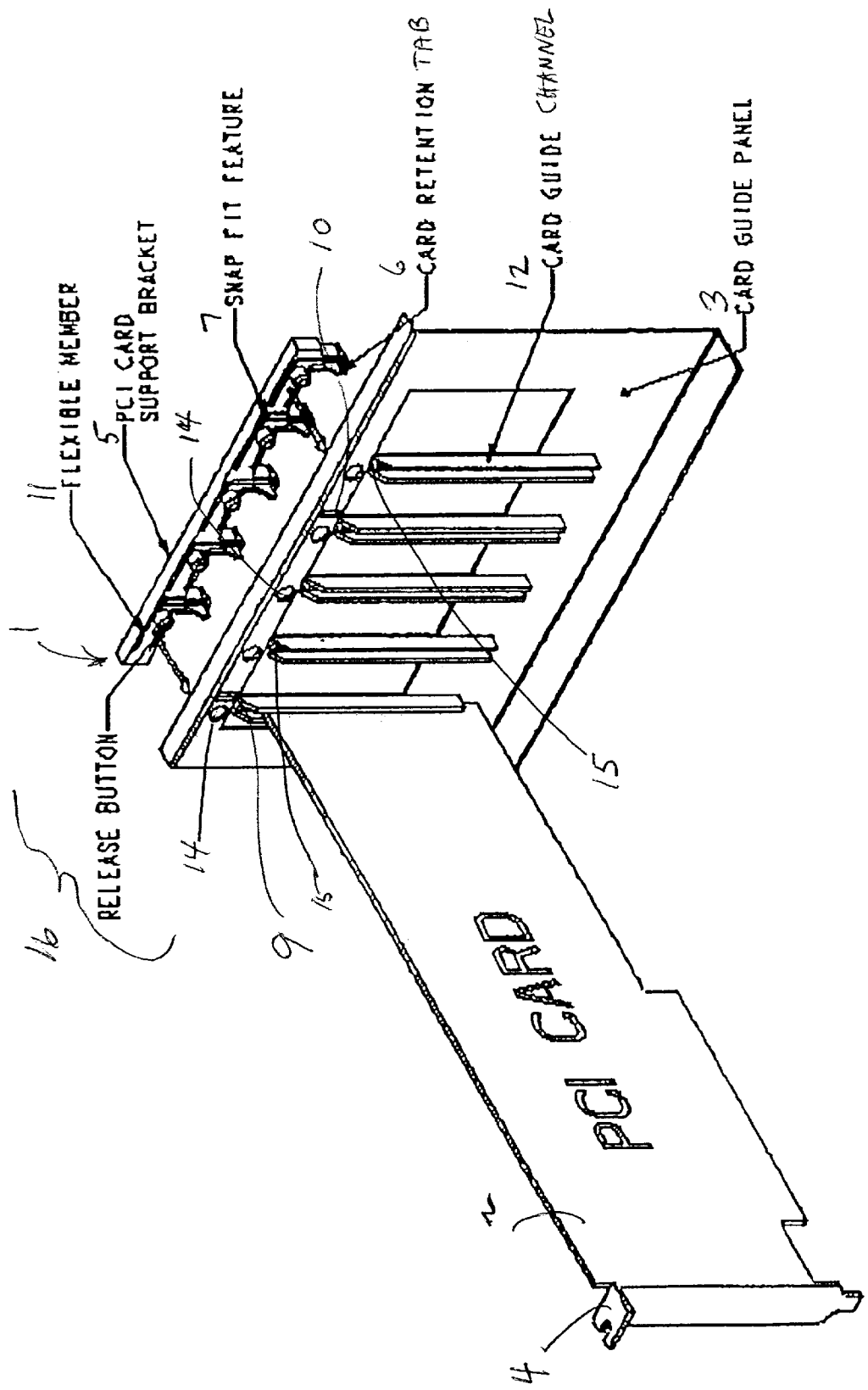
FIG. 1 is a perspective view from above and to one side of a PCI card with its rear edge supported in a card guide channel of a card guide panel wherein a card support according to the invention for releasably retaining the rear edge of the card in the card guide channel of the card guide panel is shown in spaced relation to the guide panel and card before mounting the card support on the card guide panel.

The following detailed description will focus on disclosing implementation of the card support of the present invention in a PCI bus and server chassis environment, although the present invention is not limited to use in such environments. For example, the present invention could find use in any type of electronic environment where there is a need to secure electronic cards.

Referring now to the drawings, the card support 1 is for retaining the rear edges of up to five standard full-length PCI cards 2 in a card guide panel 3 of a server on system. The front edges of the cards 2 have metal brackets 4 thereon for mounting the front edges of the cards on a chassis of the system using a conventional retainer, such as a screw, or a hot plug PCI retainer and actuator as disclosed in the commonly assigned U.S. patent application Ser. No. 09/384,390, filed concurrently with this application, and now U.S. Pat. No. 6,215,673, issued Apr. 10, 2001.

The card support 1 comprises a card support bracket 5 and a plurality of card retention tabs 6 connected to the bracket for retaining the rear edges of respective cards in the card guide panel. In the disclosed example, the card support is formed integrally as a single-piece, plastic molded part. Snap-fit elements 7 and 8 are formed integrally with the card support for attaching the card support to the card guide panel 3 without using separate fasteners. Apertures 9 and 10 in the card guide panel receive the snap-fit elements 7 and 8, respectively, for securing the card support to the card guide panel.

Figure 2:
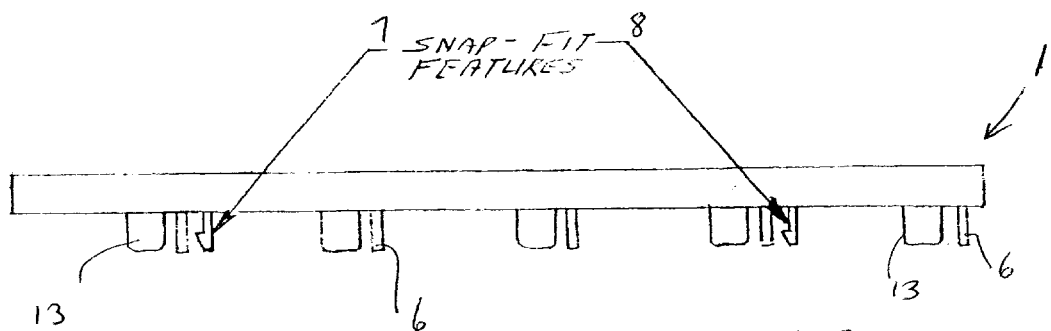
FIG. 2 is a top view of the card support of FIG. 1.
Figure 3:
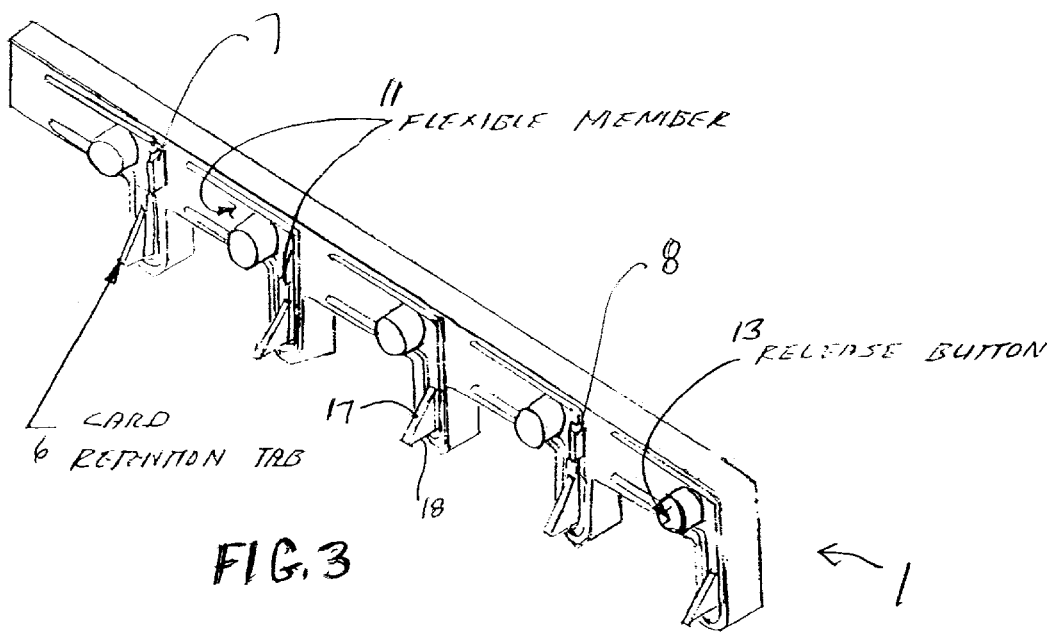
FIG. 3 is an enlarged, perspective view from above and to the right of the card support of FIGS. 1 and 2 showing the side of the card support to be mounted against the card guide panel.

The card retention tabs 6 are connected to the bracket 5 by respective flexible members 11 which permit movement of the tabs 6 relative to the bracket 5 from a first position shown in FIGS. 2 and 3 for retaining the rear edges of the respective cards 2 in card guide channels 12 in the card guide panel 3, to a second position where the free ends of the cantilever-supported resilient, flexible members 11 and card retention tabs 6 thereon are recessed within the hollow bracket 5 for allowing installation and removal of cards from respective channels 12 of the card guide panel.

The card retention tabs 6 have ramps 17 on their upper side, as shown in the drawings, for engagement with the rear edges of the electronic cards 2 being installed in the card guide channels 12 for momentarily moving the tabs back out of the way from the first position to the second position, allowing the cards to slide past the tabs. The resilience of the flexible members 11 restores the flexible members and card retention tabs 6 thereon to their initial, or rest, first position after the card is fully seated. Once the tab snaps back into this first position, it retains the card in its channel 12 in the card guide panel 3 against vertical movement out of guide channel 12. The tab is designed so that its bottom side 18 is flat and extends over the upper edge of the PCI card sufficiently to retain the card during shock and vibration.

A release button 13 is also formed on each of the L-shaped flexible members 11. When the card support 1 is attached to the card guide panel 3 by the snap-fit elements 7 and 8, the release buttons 13 extend through openings 14 in the card guide panel and the card retention tabs 6 extend through openings 15 in the panel into or immediately above respective card guide channels 12. Depression of the release buttons moves the flexible members and their retention tabs from the first position to the second position so that installed cards can be removed from the card guide panel by moving them upwardly out of the channels 12. After the PCI card is removed and the button is released, the flexible member forces the retention tab back into the card guide channel.

Together the card support 1 and card guide panel 3 constitute an apparatus 16, FIG. 1, for releasably retaining the rear edges of a plurality of electronic cards in a system.

The invention retains five cards at once, yet allows release and removal of one card at a time. Additionally, it has snap features, as referred to above, which allow it to be attached without fasteners. This reduces the number of parts required for assembly and simplifies the installation. In the disclosed example of the invention, full-length PCI cards 2, that are spaced on 1.25 inch centers, have their rear edges retained.

While we have shown an described only one example herein, it is understood that numerous changes and modifications as known to those skilled in the art could be made in the card support, the apparatus and method using the same. For example, other edges than the "rear" edge of the card could be supported using the invention and the cards could be installed and removed in a direction other than vertical. Therefore, we do not wish to be limited to the details shown and described herein, but intend to cover all such changes and modifications as are encompassed by the scope of the appended claims.

We claim:

1. A card support for releasably retaining the edges of a plurality of electronic cards in respective ones of a plurality of card guide channels in a card guide panel, said card support comprising a card support bracket which can be attached to the card guide panel and a plurality of card retention tabs connected to said bracket for movement relative to said bracket between a first position for retaining the edges of respective cards in the card guide channels in the card guide panel, and a second position for allowing installation and removal of cards from respective channels of the card guide panel.

2. The card support according to claim 1, wherein said card support is formed integrally as a single-piece, plastic molded part.

3. The card support according to claim 1, further comprising snap-fit elements on said card support for attaching said card support to a card guide panel without using separate fasteners.

4. A card support for retaining the edges of a plurality of electronic cards in a card guide panel, said card support comprising a card support bracket and a plurality of card retention tabs connected to said bracket for retaining the edges of respective cards in a card guide panel, wherein said card retention tabs are connected to said bracket by respective flexible members which permit movement of said tabs relative to said bracket from a first position for retaining the edges of respective cards in a card guide panel to a second position for allowing installation in and removal of cards from respective channels of a card guide panel.

5. The card support according to claim 4, wherein said tabs have ramps on one side thereof for engagement with the edges of electronic cards being installed in a card guide panel for momentarily moving the tabs back out of the way from said first position to said second position, allowing the cards to slide past the tabs.

6. The card support according to claim 5, wherein a side of said tabs opposite said one side is flat so as to extend over the edge of an electronic card installed in a card guide panel to retain installed cards during shock and vibration.

7. The card support according to claim 4, further comprising release buttons on respective ones of said flexible members, depression of said release buttons moving said flexible members and said retention tabs connected thereto from said first position to said second position so that installed cards can be removed from a card guide panel.

8. The card support according to claim 4, wherein said card support bracket has five retention tabs connected thereto by respective flexible members.

9. The card support according to claim 1, wherein said electronic cards are PCI cards to be retained in a card guide panel of a processor, and wherein said card retention tabs are configured for retaining the edges of respective ones of the PCI cards in the card guide panel of the processor.

10. An apparatus for releasably retaining the edges of a plurality of electronic cards in a server, said apparatus comprising a card guide panel having a plurality of card guide channels for receiving the edges of a plurality of electronic cards, and a card support attached to said card guide panel, said card support including a card support bracket and a plurality of card retention tabs connected to said bracket for movement relative to said bracket between a first position for retaining the edges of respective ones of a plurality of electronic cards installed in said card guide channels of said card guide panel, and a second position for allowing installation in and removal of cards from respective guide channels of the card guide panel.

11. The apparatus according to claim 10, wherein said card support is attached to a side of said card guide panel opposite said card guide channels and said retention tabs extend through apertures in said card guide panel and into respective ones of said card guide channels.

12. The apparatus according to claim 10, wherein said card support is formed integrally as a single-piece, plastic molded part.

13. The apparatus according to claim 10, further comprising snap-fit elements on said card support inserted in openings of said card guide panel attaching said card support to said card guide panel.

14. An apparatus for releasably retaining the edges of a plurality of electronic cards in a server, said apparatus comprising a card guide panel having a plurality of card guide channels for receiving the edges of a plurality of electronic cards, and a card support attached to said card guide panel, said card support including a card support bracket and a plurality of card retention tabs connected to said bracket for retaining the edges of respective ones of a plurality of electronic cards installed in said card guide channels of said card guide panel, wherein said card retention tabs are connected to said bracket by respective flexible members which permit movement of said tabs relative to said bracket and said card guide panel from a first position for retaining the edges of respective cards in the card guide channels of the card guide panel and a second position for allowing installation in and removal of cards from respective channels of said card guide panel.

15. The apparatus according to claim 14, wherein said tabs have ramps on a side thereof for engagement with the edges of electronic cards being installed in said card guide panel for momentarily moving the tabs back out of the way from said first position to said second position, allowing the cards to be slide past the tabs.

16. The apparatus according to claim 15, wherein a side of said tabs opposite said one side is flat and extends over the edge of an electronic card installed in the card guide panel to retain installed cards during shock and vibration.

17. The apparatus according to claim 14, further comprising release buttons on respective ones of said flexible members, depression of said release buttons moving said flexible members and said retention tabs connected thereto from said first position to said second position so that installed cards can be removed from said card guide channels of said card guide panel.

18. The apparatus according to claim 14, wherein said card support bracket has five retention tabs connected thereto by respective flexible members.

19. The apparatus according to claim 10, wherein said electronic cards are PCI cards or cards which conform to PCI mechanical specification outline.

20. A method for releasably retaining the edges of electronic cards in a card guide panel, said method comprising:
   providing a card support including a card support bracket and a plurality of card retention tabs connected to the bracket for movement relative to the bracket between a first position for retaining the edges of respective cards in a card guide panel and a second position for allowing installation and removal of cards from the card guide panel,
   attaching said card support to a card guide panel having card guide channels for the rear edges of electronic cards,
   installing the edge of at least one electronic card in a card guide channel of said card guide panel, and
   retaining said at least one electronic card in said card guide channel of said card guide panel by way of a card retention tab of said card support member.

21. The method according to claim 20, wherein said card retention tabs are connected to said bracket by way of flexible members which permit said movement of said tabs relative to said bracket and said card guide panel between said first position and said second position.

22. The method according to claim 21, wherein said flexible members further comprise release buttons thereon, and said method includes moving said tabs from said first position to said second position by depressing said release buttons.

23. A method for retaining the edges of electronic cards in a card guide panel, said method comprising:
   providing a card support including a card support bracket and a plurality of card retention tabs connected to the bracket for retaining the edges of respective cards in a card guide panel,
   attaching said card support to a card guide panel having card guide channels for the rear edges of electronic cards,
   installing the edge of at least one electronic card in a card guide channel of said card guide panel, and
   retaining said at least one electronic card in said card guide channel of said card guide panel by way of a card retention tab of said card support member, wherein said step of attaching includes mounting said card support bracket on one side of said card guide panel opposite to a side thereof having said card guide channels with said card retention tabs extending through apertures in said card guide panel into said card guide channels.

\* \* \* \* \*